US012230595B2

(12) United States Patent
Cheng et al.

(10) Patent No.: US 12,230,595 B2
(45) Date of Patent: Feb. 18, 2025

(54) METAL BUMPS AND METHOD FORMING SAME

(71) Applicant: Taiwan Semiconductor Manufacturing Co., Ltd., Hsinchu (TW)

(72) Inventors: Ming-Da Cheng, Taoyuan (TW); Yung-Ching Chao, Gukeng Township (TW); Chun Kai Tzeng, Hsinchu (TW); Cheng Jen Lin, Kaohsiung (TW); Chin Wei Kang, Tainan (TW); Yu-Feng Chen, Hsinchu (TW); Mirng-Ji Lii, Sinpu Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 259 days.

(21) Appl. No.: 17/333,187

(22) Filed: May 28, 2021

(65) Prior Publication Data
US 2021/0288009 A1 Sep. 16, 2021

Related U.S. Application Data

(62) Division of application No. 16/458,719, filed on Jul. 1, 2019, now Pat. No. 11,024,593.

(Continued)

(51) Int. Cl.
*H01L 23/00* (2006.01)
*H01L 23/31* (2006.01)
(Continued)

(52) U.S. Cl.
CPC .......... *H01L 24/11* (2013.01); *H01L 23/3192* (2013.01); *H01L 23/5226* (2013.01);
(Continued)

(58) Field of Classification Search
CPC .............. H01L 23/3192; H01L 23/488; H01L 23/5226; H01L 24/03; H01L 24/05;
(Continued)

(56) References Cited

U.S. PATENT DOCUMENTS

| 6,426,371 B1* | 7/2002 | Li .......................... H01L 23/145 501/12 |
| 7,348,210 B2 | 3/2008 | Daubenspeck et al. |

(Continued)

FOREIGN PATENT DOCUMENTS

| CN | 103915374 A | 7/2014 |
| CN | 104854509 A | 8/2015 |

(Continued)

OTHER PUBLICATIONS

TWI425569B, Carlo et al., translation. (Year: 2014).*

*Primary Examiner* — Andres Munoz
(74) *Attorney, Agent, or Firm* — Slater Matsil, LLP

(57) ABSTRACT

A method of forming an integrated circuit structure includes forming a patterned passivation layer over a metal pad, with a top surface of the metal pad revealed through a first opening in the patterned passivation layer, and applying a polymer layer over the patterned passivation layer. The polymer layer is substantially free from N-Methyl-2-pyrrolidone (NMP), and comprises aliphatic amide as a solvent. The method further includes performing a light-exposure process on the polymer layer, performing a development process on the polymer layer to form a second opening in the polymer layer, wherein the top surface of the metal pad is revealed to the second opening, baking the polymer, and forming a conductive region having a via portion extending into the second opening.

20 Claims, 19 Drawing Sheets

Related U.S. Application Data

(60) Provisional application No. 62/738,511, filed on Sep. 28, 2018.

(51) Int. Cl.
*H01L 23/522* (2006.01)
*H01L 23/488* (2006.01)

(52) U.S. Cl.
CPC ............. *H01L 24/08* (2013.01); *H01L 24/12* (2013.01); *H01L 24/13* (2013.01); *H01L 24/16* (2013.01); *H01L 24/32* (2013.01); *H01L 23/488* (2013.01); *H01L 24/03* (2013.01); *H01L 24/05* (2013.01); *H01L 2224/0401* (2013.01); *H01L 2224/32501* (2013.01)

(58) Field of Classification Search
CPC ......... H01L 24/08; H01L 24/11; H01L 24/13; H01L 24/16; H01L 24/32; H01L 2224/0345; H01L 2224/03452; H01L 2224/03912; H01L 2224/0401; H01L 2224/05558; H01L 2224/05573; H01L 2224/1147; H01L 2224/16145; H01L 2224/16227; H01L 2224/32145; H01L 2224/32225; H01L 2224/32501; H01L 2224/73204; H01L 2224/94; H01L 225/06513
See application file for complete search history.

(56) References Cited

U.S. PATENT DOCUMENTS

| | | | |
|---|---|---|---|
| 7,569,937 B2 | 8/2009 | Kuechenmeister et al. | |
| 7,838,424 B2 | 11/2010 | Karta et al. | |
| 7,863,742 B2 | 1/2011 | Yu et al. | |
| 7,932,601 B2 | 4/2011 | Chang et al. | |
| 8,592,300 B2 | 11/2013 | Lin et al. | |
| 8,754,508 B2 | 6/2014 | Chen et al. | |
| 8,772,151 B2 | 7/2014 | Chen | |
| 8,846,548 B2 | 9/2014 | Tu et al. | |
| 9,105,530 B2 * | 8/2015 | Lin | H01L 24/13 |
| 9,922,896 B1 | 3/2018 | Cheng et al. | |
| 10,290,530 B2 | 5/2019 | Cheng et al. | |
| 2004/0053483 A1 | 3/2004 | Nair et al. | |
| 2005/0006766 A1 * | 1/2005 | Nakayoshi | H01L 23/36 |
| | | | 257/E23.101 |
| 2005/0098901 A1 * | 5/2005 | Chang | H01L 24/81 |
| | | | 257/E21.511 |
| 2009/0045511 A1 * | 2/2009 | Meyer | H01L 24/02 |
| | | | 257/738 |
| 2011/0101527 A1 | 5/2011 | Cheng et al. | |
| 2011/0254151 A1 | 10/2011 | Lin et al. | |
| 2012/0181686 A1 | 7/2012 | Park et al. | |
| 2012/0319251 A1 | 12/2012 | Yu et al. | |
| 2013/0341800 A1 | 12/2013 | Tu et al. | |
| 2014/0015122 A1 | 1/2014 | Chou et al. | |
| 2014/0045379 A1 | 2/2014 | Chen | |
| 2014/0048926 A1 * | 2/2014 | Wang | H01L 24/94 |
| | | | 257/737 |
| 2014/0077356 A1 | 3/2014 | Chen et al. | |
| 2014/0183693 A1 | 7/2014 | Tsai et al. | |
| 2014/0187103 A1 | 7/2014 | Chen et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0262468 A1 | 9/2014 | Chen et al. | |
| 2014/0264885 A1 | 9/2014 | Tsai et al. | |
| 2015/0011082 A1 | 1/2015 | Shen et al. | |
| 2015/0228587 A1 | 8/2015 | Cheng et al. | |
| 2015/0228600 A1 | 8/2015 | Lin | |
| 2018/0082917 A1 | 3/2018 | Cheng et al. | |

FOREIGN PATENT DOCUMENTS

| | | | |
|---|---|---|---|
| CN | 107833837 A | | 3/2018 |
| KR | 20120084194 A | | 7/2012 |
| KR | 20150070215 A | | 6/2015 |
| TW | 201322379 A | | 6/2013 |
| TW | I425569 B | * | 2/2014 |
| TW | 201826023 A | | 7/2018 |
| TW | 201826408 A | | 7/2018 |

* cited by examiner

METAL BUMPS AND METHOD FORMING SAME

PRIORITY CLAIM AND CROSS-REFERENCE

This application is a divisional of U.S. patent application Ser. No. 16/458,719, entitled "Metal Bumps and Method Forming Same," filed Jul. 1, 2019, which claims the benefit of the U.S. Provisional Application No. 62/738,511, filed Sep. 28, 2018, and entitled "Metal Bump and Connections to Underlying Pads," which applications are hereby incorporated herein by reference.

BACKGROUND

In the formation of integrated circuits, devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

A redistribution line is then formed to connect to the metal pad, followed by the formation of a second polymer layer over the redistribution line. An Under-Bump-Metallurgy (UBM) is formed extending into an opening in the second polymer layer. The UBM is electrically connected to the redistribution line. A metal pillar may be formed on the UBM. A solder ball is then placed over the UBM and reflowed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
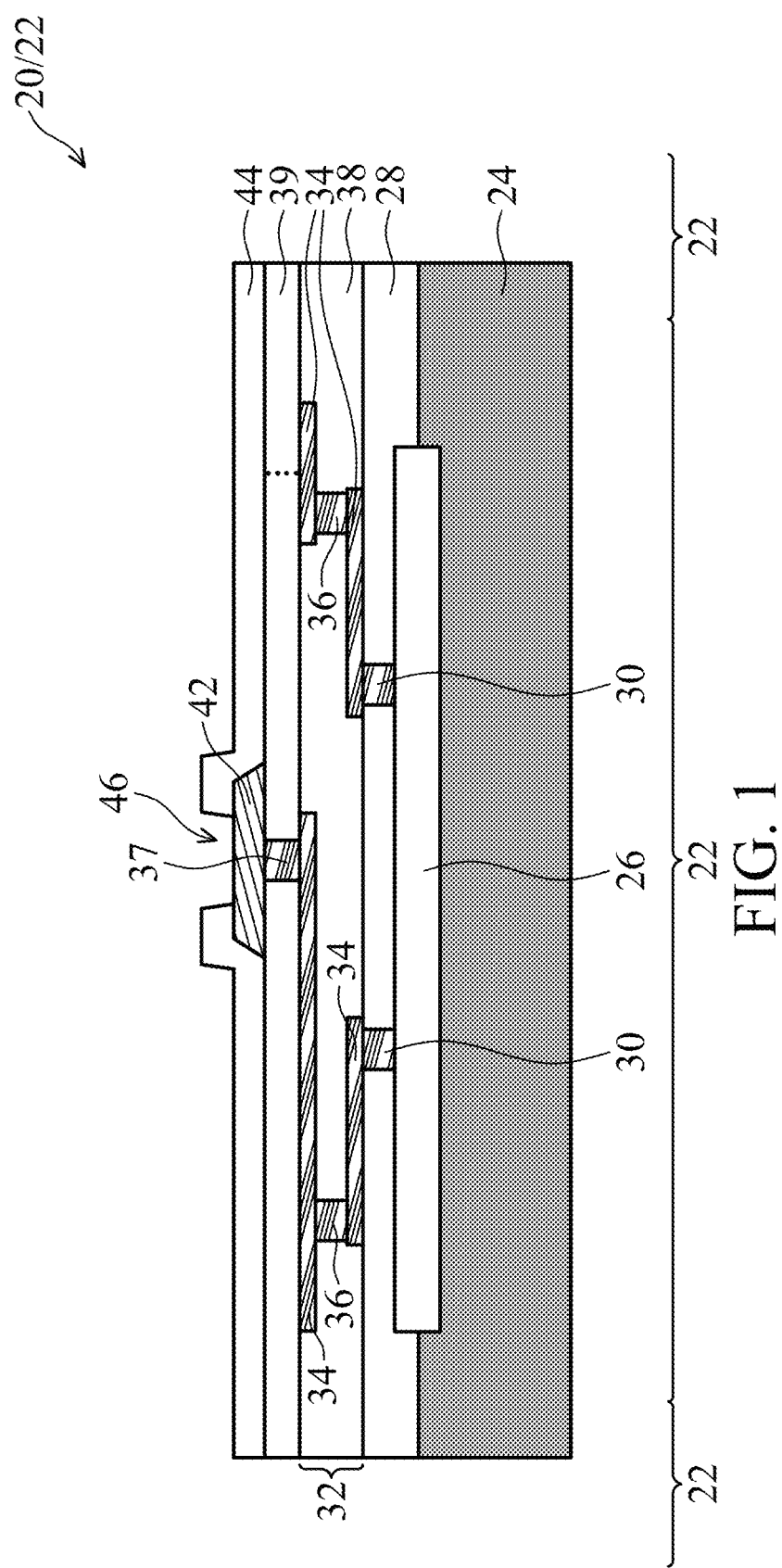
FIGS. 1-10 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit structure and the method of forming the same are provided in accordance with some embodiments. The intermediate stages in the formation of the integrated circuit structure are illustrated in accordance with some embodiments. Some variations of some embodiments are discussed. Throughout the various views and illustrative embodiments, like reference numbers are used to designate like elements. In accordance with some embodiments of the present disclosure, a metal bump, which includes a via portion and an overlying bump portion, is formed. The via portion extends into a polymer layer to connect to an underlying conductive feature such as a metal pad. The profile including the width, the height, the tilt angle, and the R-angle of via portion is adjusted in order to reduce the stress applied on the underlying low-k dielectric layers. The material of the polymer layer is also adjusted to achieve the desirable profile of the via portion.

Figure 19:
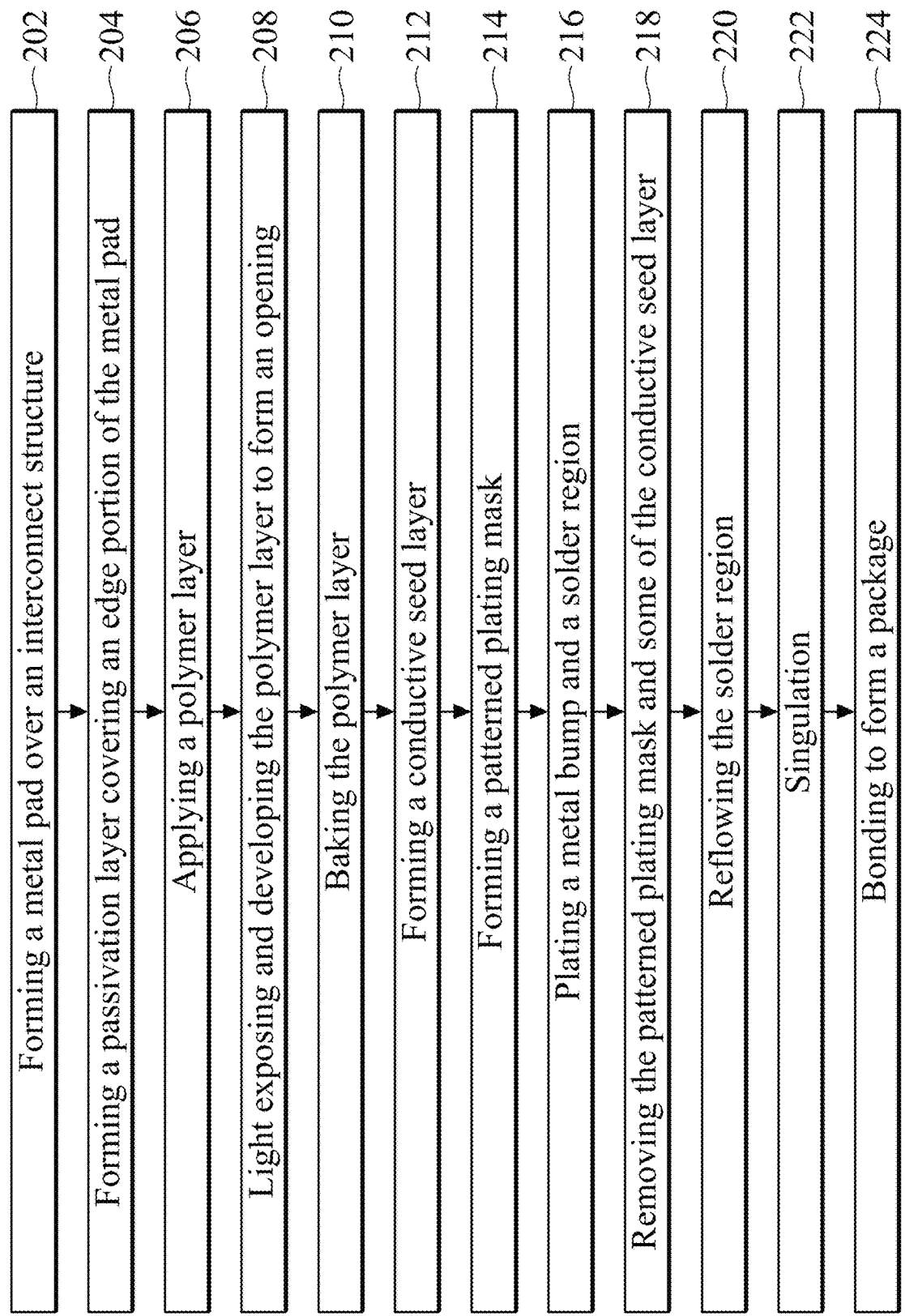
FIG. 19 illustrates a process flow for forming a package in accordance with some embodiments.

FIGS. 1 through 10 illustrate the cross-sectional views of intermediate stages in the formation of an integrated circuit structure including the metal bump in accordance with some embodiments of the present disclosure. The corresponding processes are also reflected schematically in the process flow 200 as shown in FIG. 19.

FIG. 1 illustrates a cross-sectional view of package component 20. In accordance with some embodiments of the present disclosure, package component 20 is a device wafer including active devices and possibly passive devices, which are represented as integrated circuit devices 26. Device wafer 20 may include a plurality of chips 22 therein, with one of chips 22 illustrated schematically. In accordance with alternative embodiments of the present disclosure, package component 20 is an interposer wafer, which does not include active devices, and may or may not include passive devices such as inductors, resistors, capacitors, etc. In accordance with yet alternative embodiments of the present disclosure, package component 20 is a package substrate strip, which includes core-less package substrates or the package substrates with cores therein. In subsequent discussion, a device wafer is discussed as an example of package component 20. The embodiments of the present disclosure may also be applied on interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of crystalline silicon, crystalline germanium, silicon germanium, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may be formed to extend into semiconductor substrate 24, wherein the through-vias are used to electrically inter-couple the features on the opposite sides of wafer 20.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers, and substrate 24 may be a semiconductor substrate or a dielectric substrate.

Inter-Layer Dielectric (ILD) 28 is formed over semiconductor substrate 24 and fills the space between the gate stacks of transistors (not shown) in integrated circuit devices 26. In accordance with some embodiments of the present disclosure, ILD 28 is formed of Phospho Silicate Glass (PSG), Boro Silicate Glass (BSG), Boron-doped Phospho Silicate Glass (BPSG), Fluorine-doped Silicate Glass (FSG), Tetra Ethyl Ortho Silicate (TEOS), or the like. ILD 28 may be formed using spin coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 may reside interconnect structure 32. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may be formed a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material and then performing a curing process to drive out the porogen, and hence the remaining dielectric layers 38 are porous.

The formation processes of metal lines 34, vias 36, and dielectric layers 38 may include single damascene processes and/or dual damascene processes. In a single damascene process, a trench is first formed in one of dielectric layers 38, followed by filling the trench with a conductive material. A planarization process such as a Chemical Mechanical Polish (CMP) process or a mechanical grinding process is then performed to remove the excess portions of the conductive material higher than the top surface of the respective IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier layer and a copper-containing metallic material over the diffusion barrier layer. The diffusion barrier layer may include titanium, titanium nitride, tantalum, tantalum nitride, or the like.

Wafer 20 further includes top conductive (metal) features such as metal lines, metal pads, or vias (denoted as 37) in a top dielectric layer 39. In accordance with some embodiments of the present disclosure, dielectric layer 39 is formed of a low-k dielectric material similar to the material of lower ones of dielectric layers 38. In accordance with other embodiments, dielectric layer 39 is formed of a non-low-k dielectric material, which may include silicon nitride, Undoped Silicate Glass (USG), silicon oxide, or the like. Dielectric layer 39 may also have a multi-layer structure including, for example, two USG layers and a silicon nitride layer in between. Dielectric layer 39 is sometimes referred to as a passivation layer. Top metal features 37 may also be formed of copper or a copper alloy, and may have a dual damascene structure or a single damascene structure.

Metal pad 42 is formed over and contacting metal feature 37. The respective process is illustrated as process 202 in the process flow 200 as shown in FIG. 19. The illustrated metal pad 42 represents a plurality of metal pads at the same level. Metal pad 42 may be electrically coupled to integrated circuit devices 26 through conductive features such as metal lines 34 and vias 36. In accordance with some embodiments of the present disclosure, metal pad 42 is an aluminum pad or an aluminum-copper pad, and other metallic materials may be used. In accordance with some embodiments of the present disclosure, metal pad 42 has an aluminum percentage greater than about 95 percent.

A patterned passivation layer 44 is formed on metal pad 42. The respective process is illustrated as process 204 in the process flow 200 as shown in FIG. 19. Some portions of passivation layer 44 may cover the edge portions of metal pad 42, and the central portion of the top surface of metal pad 42 is exposed through opening 46. In accordance with some embodiments of the present disclosure, opening 46 is formed by etching passivation layer 44 in an etching process. Passivation layer 44 may be a single layer or a composite layer, and may be formed of a non-porous material. In accordance with some embodiments of the present disclosure, passivation layer 44 is a composite layer including a silicon oxide layer and a silicon nitride layer over the silicon oxide layer.

Figure 2:
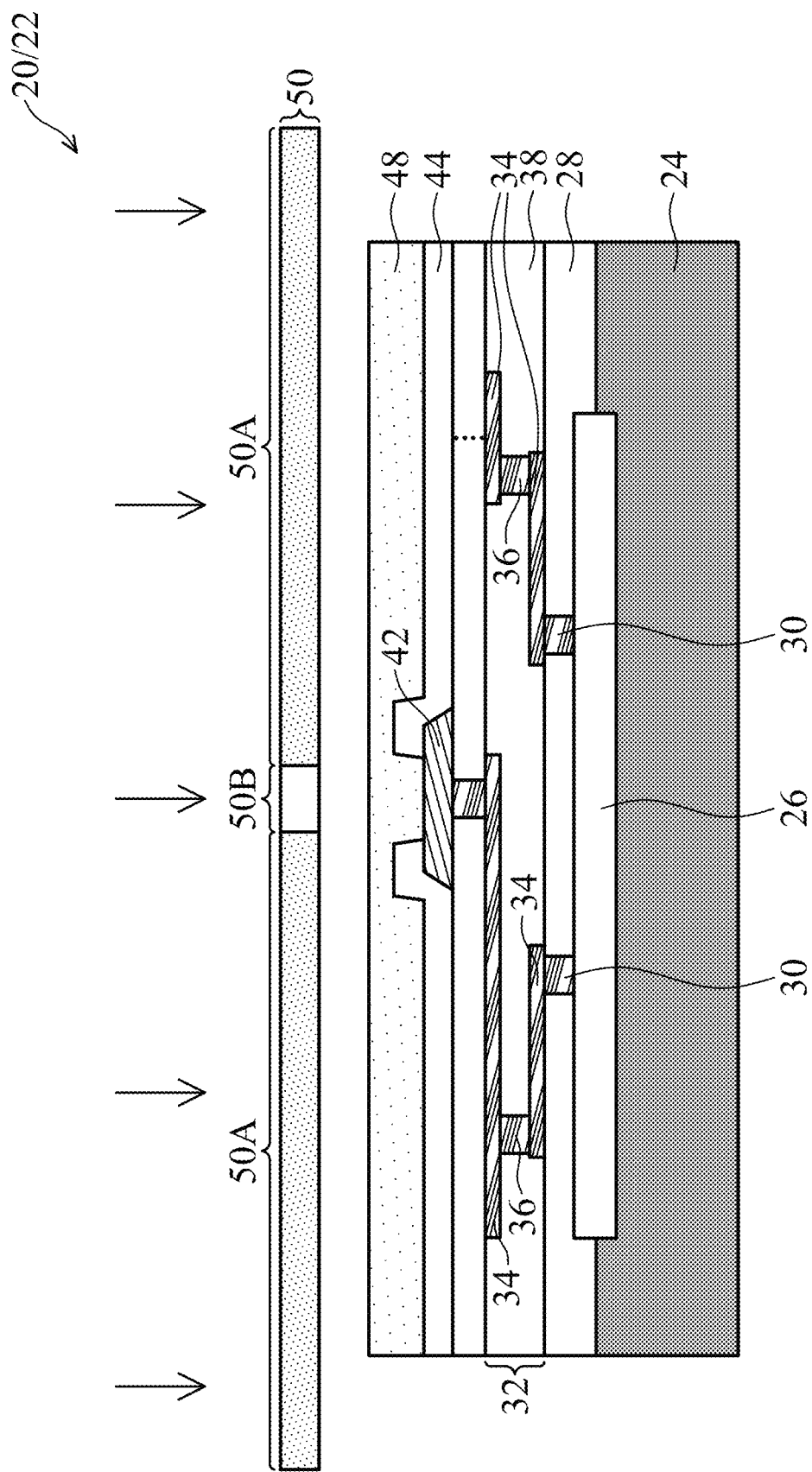

FIG. 2 illustrates the application of dielectric layer 48. The respective process is illustrated as process 206 in the process flow 200 as shown in FIG. 19. In accordance with some embodiments of the present disclosure, dielectric layer 48 is formed of polymer diluted in a solvent. The formation of dielectric layer 48 may include spin-coating polymer layer 48 and pre-baking polymer layer 48, so that it may maintain its shape in the subsequent light-exposure process and development process. In accordance with some embodiments of the present disclosure, the pre-baking is performed at a temperature in the range between about 100 degrees and about 180 degrees. The pre-baking duration may be in the range between about 2 minutes and about 10 minutes.

In accordance with some embodiments of the present disclosure, N-Methyl-2-pyrrolidone (NMP), which was conventional used as the solvent, is replaced by aliphatic amide, so that the desirable profile (FIGS. 3 and 11) may be generated when openings are formed in dielectric layer 48. In accordance with some embodiments of the present disclosure, the coated dielectric layer 48 (when and after it is coated but before baking) is free from NMP. In accordance with alternative embodiments of the present disclosure, the coated dielectric layer 48 (when and after it is coated but before baking), is substantially free from NMP, for example, including NMP with a weight percentage smaller than about 0.3 percent, or smaller than about 0.1 percent. It is appreciated that some analyzing equipment for detecting the composition of the polymer may detect the concentration of some chemicals such as NMP with concentrations higher than certain value such as 0.3 percent, but does not have the accuracy of detecting the NMP having concentrations lower than about 0.3 percent.

In addition, to suit to the use of aliphatic amide as solvent, the coated polymer 48 may also include other additives such as alkoxy decane. Alkoxy decane is also a polymer. As a result, the resulting polymer may include silicon alkoxide (with the formula $Si(OR)_n$), which may be detected using Fourier transform Infrared (FTIR) and Gas Chromatography Mass Spectrometry (GCMS). In accordance with some embodiments of the present disclosure, the alkoxy decane in the coated dielectric layer 48 has a weight percentage greater than about 0.1 percent (excluding the solvent). The weight percentage of silicon alkoxide is detectable, and may be in the range between about 0.1 percent and about 10 percent.

FIG. 2 also illustrates the light-exposure process of dielectric layer 48, which is performed using lithography mask 50. The respective process is illustrated as process 208 in the process flow 200 as shown in FIG. 19. Lithography mask 50 includes opaque portions 50A for blocking the light used in the light-exposure, and transparent portion 50B allowing the light to pass through, so that selected portions of dielectric layer 48 are exposed.

Figure 3:
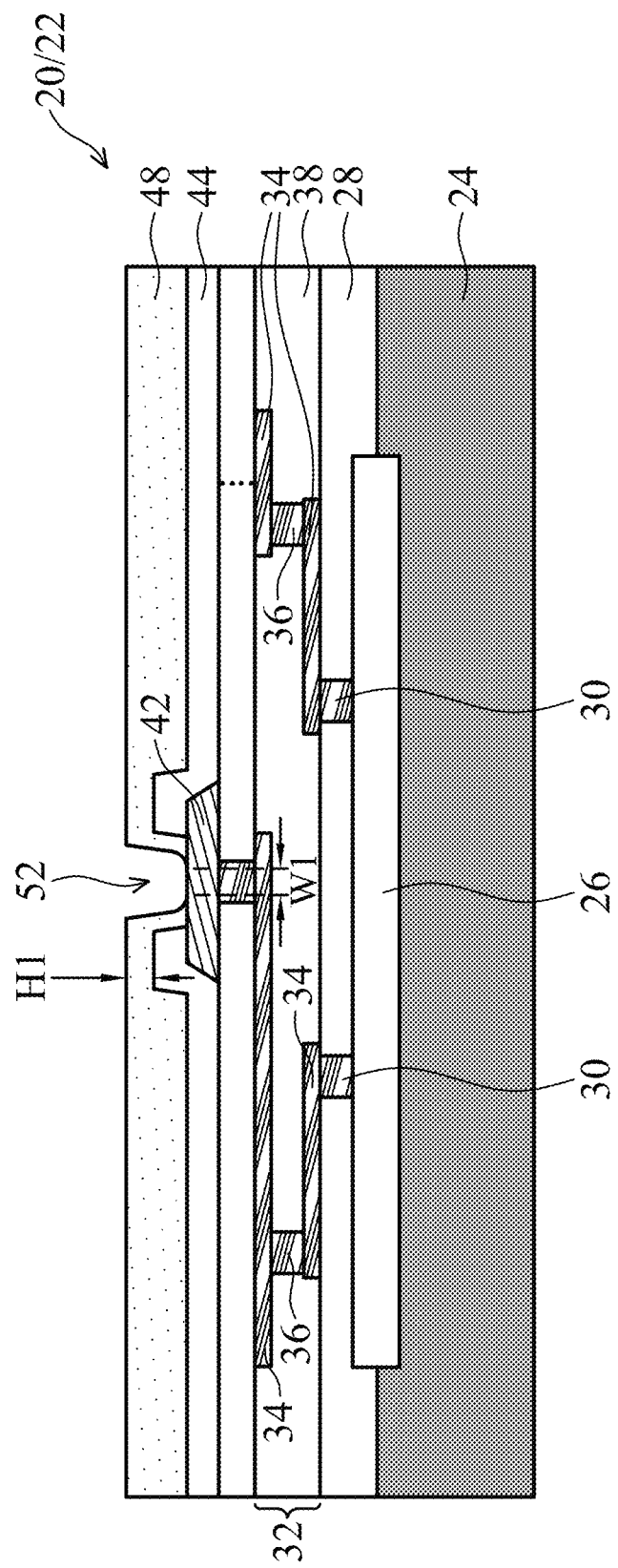

After the light exposure, a development process is performed, so that opening 52 is formed in dielectric layer 48, as shown in FIG. 3. The respective process is also illustrated as process 208 in the process flow 200 as shown in FIG. 19. The top surface of metal pad 42 is exposed to opening 52.

After the development process, a main baking process, which is also a curing process, is performed to cure dielectric layer 48. The respective process is illustrated as process 210 in the process flow 200 as shown in FIG. 19. In accordance with some embodiments of the present disclosure, the main baking process is performed at a temperature in the range between about 200 degrees (° C.) and about 400 degrees. The main baking duration may be in the range between about 1 hour and about 12 hours. It is observed that the tilt angle θ (FIG. 11) is related to the baking temperature, and higher temperature results in greater tilt angle θ, and vice versa. Accordingly, the baking temperature is adjusted in order to adjust tilt angle θ. For example, tilt angle θ may be in the range greater than about 45 degrees and lower than about 90 degrees, which may be achieved through a pre-baking temperature in the range between about 120 degrees and about 210 degrees. Tilt angle θ may also be in the range between about 70 degrees and about 80 degrees, which may be achieved through a pre-baking temperature in the range between about 140 degrees and about 160 degrees. In addition, the tilt angle θ may be increased by increasing the exposure focus of the tool for the light-exposure process of dielectric layer 48 in accordance with some embodiments. The desirable tilt angle θ may be achieved by adjusting the exposure focus to an appropriate value, which may be discovered through experiments.

Figure 11:
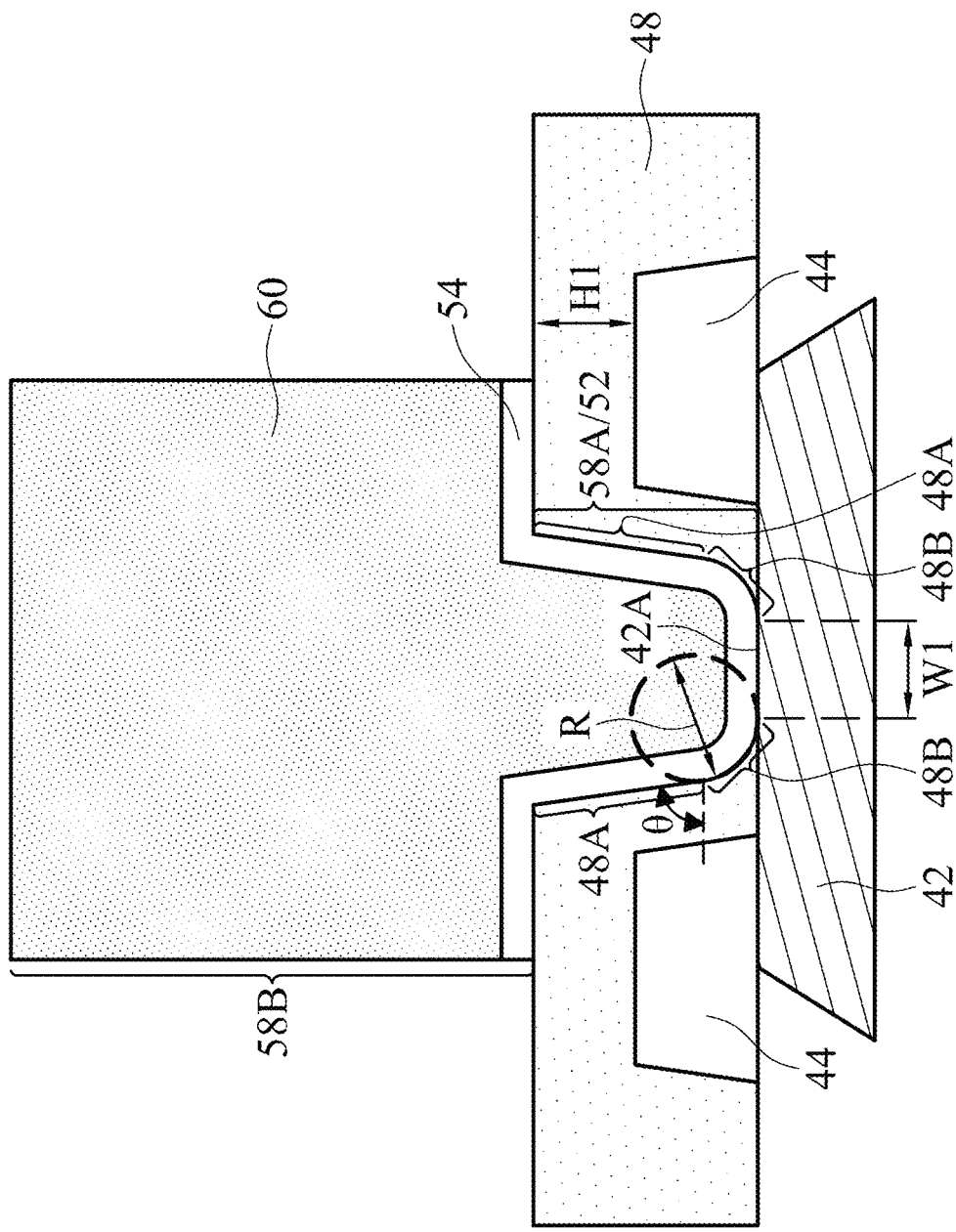
FIG. 11 illustrates a magnified cross-sectional view of a portion of a metal bump in accordance with some embodiments.

During the baking process, dielectric layer 48 shrinks, and its thickness is reduced. FIG. 11 illustrates a magnified view of opening 52, which is filled with via portion 58A of metal bump 58 in a subsequent process. As shown in FIG. 11, after the main baking process, dielectric layer 48 has a thickness H1, which is the thickness of a portion of dielectric layer 48 directly over metal pad 42 and passivation layer 44. In accordance with some embodiments of the present disclosure, thickness H1 is equal to or greater than about 5 μm, and may be in the range between about 5 μm and about 15 μm. As discussed in subsequent paragraphs, adjusting thickness H1 to be equal to or greater than about 5 μm is critical in reducing the stress in low-k dielectric layers 38 to a level that no cracks are generated in low-k dielectric layers 38 (FIG. 3). Via portion 58A of metal bump 58 contacts metal pad 42 to form an interface, which has width W1. Width W1 is also the bottom width of opening 52 as shown in FIG. 3. In accordance with some embodiments of the present disclosure, width W1 is equal to or smaller than about 20 μm, and may be in the range between about 8 μm and about 20 μm. As discussed in subsequent paragraphs, making width W1 to be equal to or smaller than about 20 μm is critical in reducing the stress in low-k dielectric layers 38 to a level that no cracks are generated in low-k dielectric layers 38.

In a cross-sectional view, as shown in FIG. 11, dielectric layer 48 has straight sidewalls 48A, and round sidewalls 48B connected to straight sidewalls 48A. The round sidewalls 48B are also connected to the top surface 42A of metal pad 42, which top surface also forms the bottom surface of opening 52 in FIG. 3. The round sidewalls 48B form parts of circles that have an R-angle, which is the diameter R of the respective circles to which round sidewalls 48B fit. In accordance with some embodiments of the present disclosure, the R-angle is smaller than about 4 μm. Furthermore, the R-angle is greater than 0 μm, and may be greater than about 1 μm. In accordance with some embodiments of the present disclosure, the R-angle is in the range between about 1 μm and about 3 μm. As will be discussed in subsequent paragraphs, making the R-angle to be equal to or smaller than about 4 μm is critical in reducing the stress in low-k dielectric layers 38 to a level that no cracks are generated in low-k dielectric layers 38.

Figure 4:
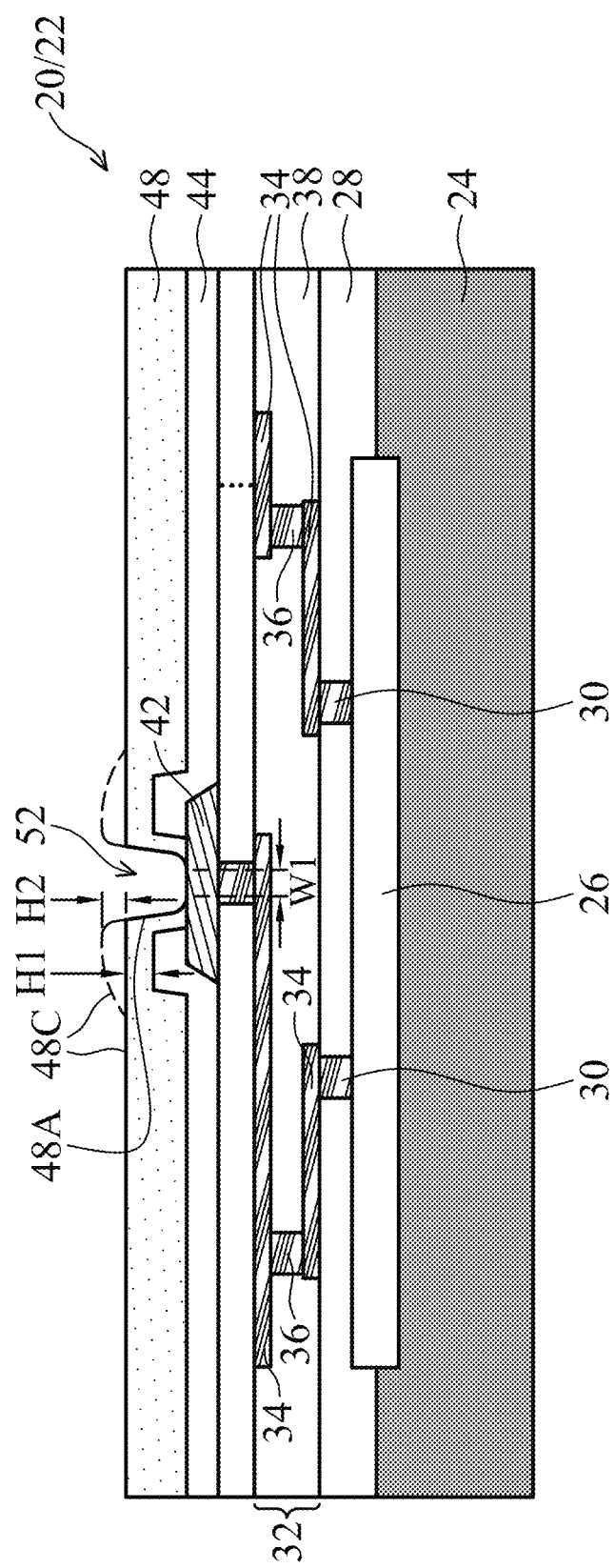

As shown in FIGS. 3, 4, and 11, the top surface of passivation layer 44 includes a first portion (the illustrated lower portion or lower part, also referred to as a first top surface or a second top surface) that is located beyond an edge of the metal pad 42, and a second portion (the illustrated higher portion or a higher part, also referred to as a second top surface or a first top surface) that overlaps metal pad 42. The straight sidewalls 48A may have a tilt angle θ, which is the sharp angle formed between straight sidewalls 48A and a horizontal plane (which is parallel to a top surface and a bottom surface of package component 22). In accordance with some embodiments of the present disclosure, tilt angle θ is in the range between about 45 degrees and about 90 degrees. As will be discussed in subsequent paragraphs, making the tilt angle θ to be in the range between about 45 degrees and about 90 degrees is critical in reducing the stress in low-k dielectric layers 38 to a level that no cracks are generated in low-k dielectric layers 38.

In accordance with some embodiments, as shown in FIG. 4, due to the adoption of solvent aliphatic amide and alkoxy decane, the top surface 48C of dielectric layer 48 may rise in the region where the top surface of dielectric layer 48 joins sidewalls 48A. In the regions farther away from opening 52, the top surfaces 48C of dielectric layer 48 are planar. In accordance with some embodiments of the present disclosure, the rising-up height H2 (also referred to as crown height) is smaller than 1.5 μm, and may be in the range between about 0.5 μm and about 1.5 μm. The rising surface 48C is illustrated using dashed lines. In accordance with some embodiments, a part (portion) of the top surface of passivation layer 44 overlapping metal pad 42 is flat. When top surface 48C includes the rising-up portion (as shown in FIG. 4), the rising-up portion, which overlaps the flat part of the top surface of the passivation layer 44 and overlaps metal pad 42, is curved. Accordingly, the rising-up part is more curved than the flat part of the top surface of the passivation layer 44. Furthermore, there are rising-up parts on opposite sides of the opening 52 and have same shape and a same rising-up height H2. The top surface of dielectric layer 48 also has the possibility of being planar in the region where the top surface of dielectric layer 48 joins sidewalls 48A, as shown by solid lines in FIG. 4 (also shown in FIG. 3). The rising-up of the top surface is not shown in FIGS. 5 through 10, although the top surfaces in these figures may also rise.

FIGS. 5 through 9 illustrate the formation of a metal bump. In accordance with some embodiments of the present disclosure, the metal bump is formed to be in contact with metal pad 42. In accordance with alternative embodiments of the present disclosure, additional conductive lines and possibly dielectric layers are formed over metal pad 42 and underlying the metal bump. For example, there may be Redistribution Lines (RDLs, sometimes referred to Post-Passivation Interconnects (PPIs)) and polymer layers formed, with the PPIs in the polymer layers interconnecting metal pad 42 to the overlying metal bump.

Figure 5:
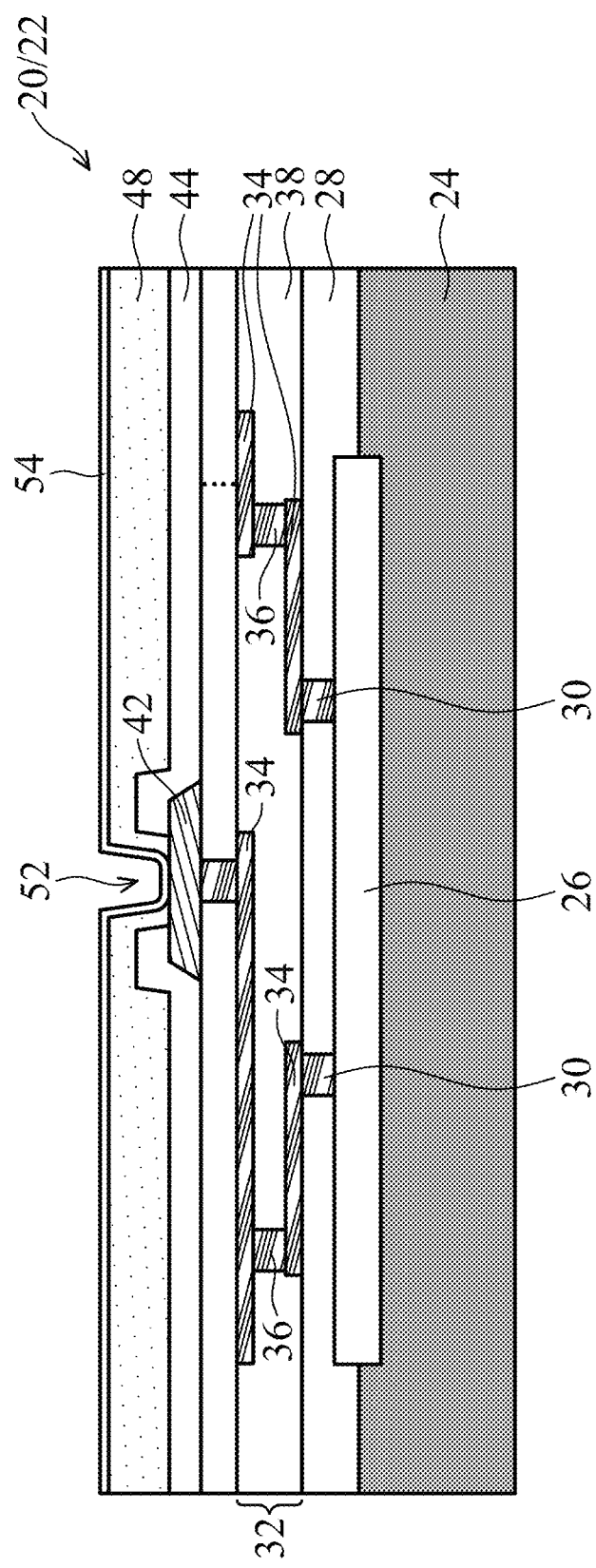

Referring to FIG. 5, seed layer 54 is deposited over dielectric layer 48. Seed layer 54 is a conductive seed layer, and may be a metal seed layer in accordance with some embodiments. The respective process is illustrated as process 212 in the process flow 200 as shown in FIG. 19. In accordance with some embodiments of the present disclosure, seed layer 54 is a composite layer comprising two or more layers. For example, seed layer 54 may include a lower layer and an upper layer, wherein the lower layer may include a titanium layer, a titanium nitride layer, a tantalum layer, a tantalum nitride layer, or the like. The materials of the upper layer may include copper or a copper alloy. In accordance with alternative embodiments, seed layer 54 is a single layer, which may be a copper layer, for example. Seed layer 54 may be formed using Physical Vapor Deposition (PVD), Plasma Enhanced CVD (PECVD), atomic layer deposition, etc., while other applicable methods may also be used. Seed layer 54 is a conformal layer that extends into opening 52.

Figure 6:
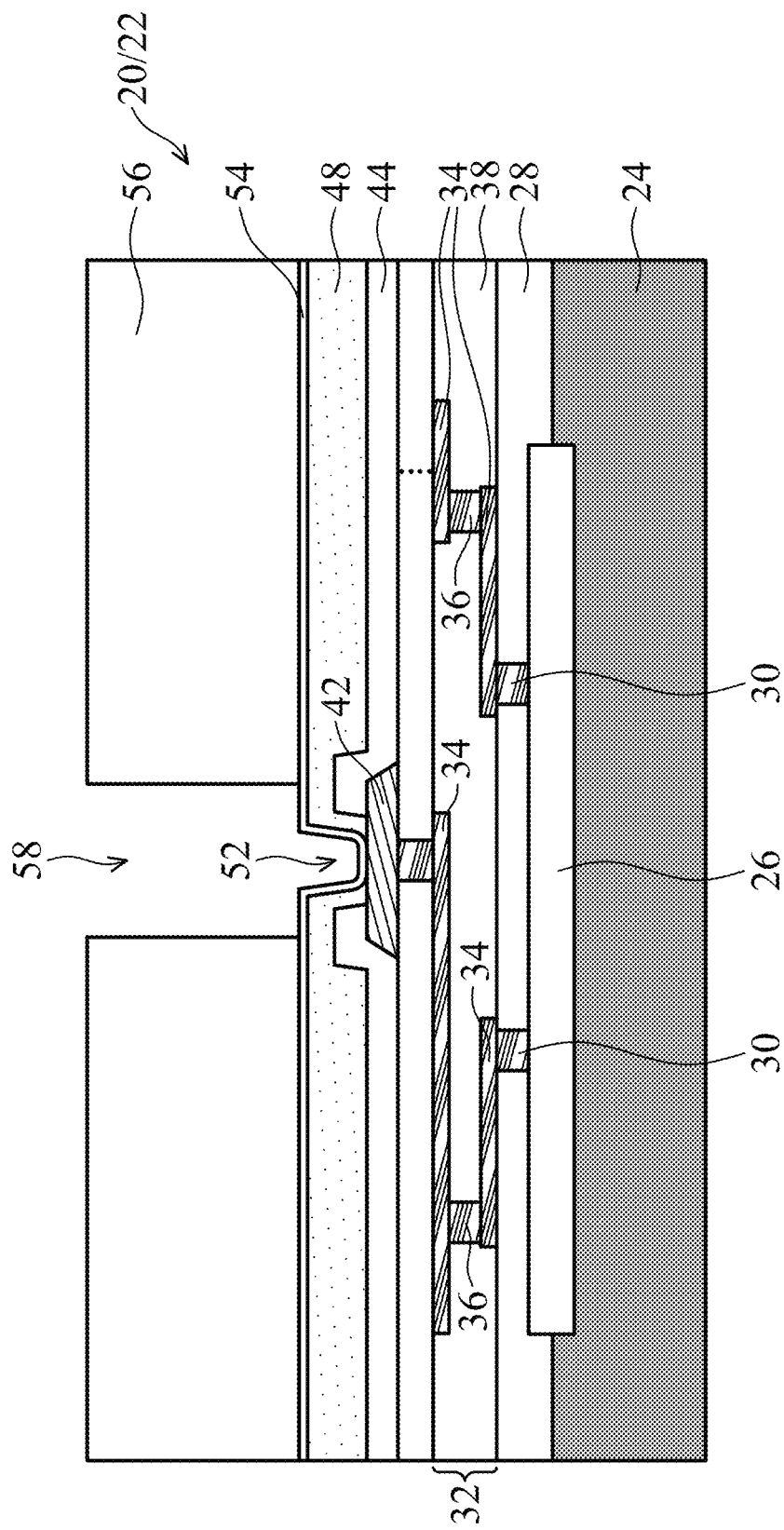

FIG. 6 illustrates the formation of a patterned plating mask 56. The respective process is illustrated as process 214 in the process flow 200 as shown in FIG. 19. In accordance with some embodiments of the present disclosure, plating mask 56 is formed of a photo resist. Plating mask 56 is patterned to form opening 58, through which a portion of the seed layer 54 is exposed. The patterning of plating mask 56 may include a light-exposure process and a development process.

Figure 7:
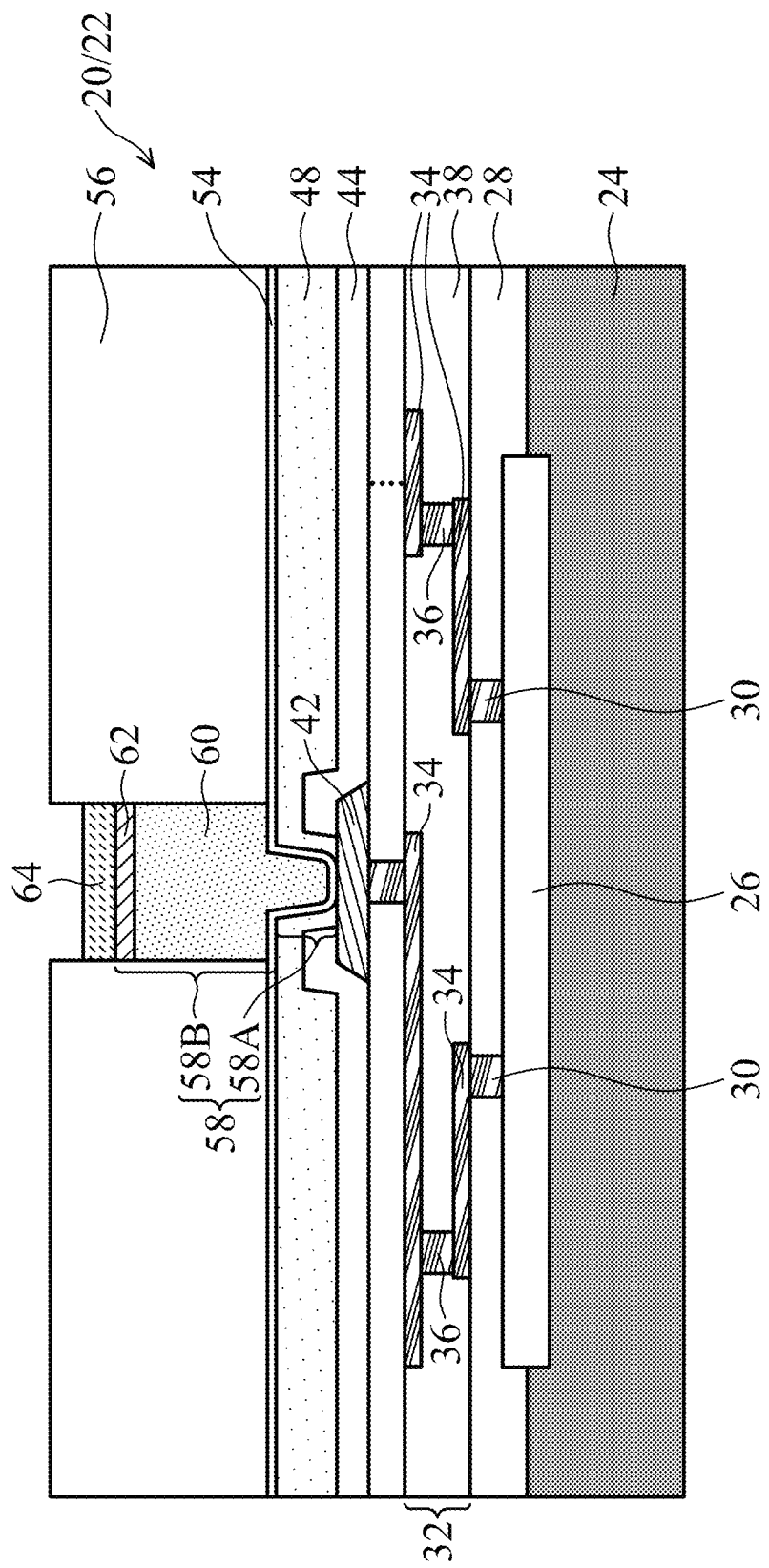

Next, referring to FIG. 7, a plating process(es) is performed to form metal bump 58. The respective process is illustrated as process 216 in the process flow 200 as shown in FIG. 19. Metal bump 58 may include one or a plurality of non-solder metal layers. For example, metal bump 58 may include copper-containing layer 60 including copper or a copper alloy. Metal bump 58 may also include metal cap layer 62 over copper-containing layer 60. Metal cap layer 62 may be a nickel-containing layer, a palladium-containing layer, a gold layer, and/or the like, or a composite layer comprising the aforementioned layers.

Figure 8:
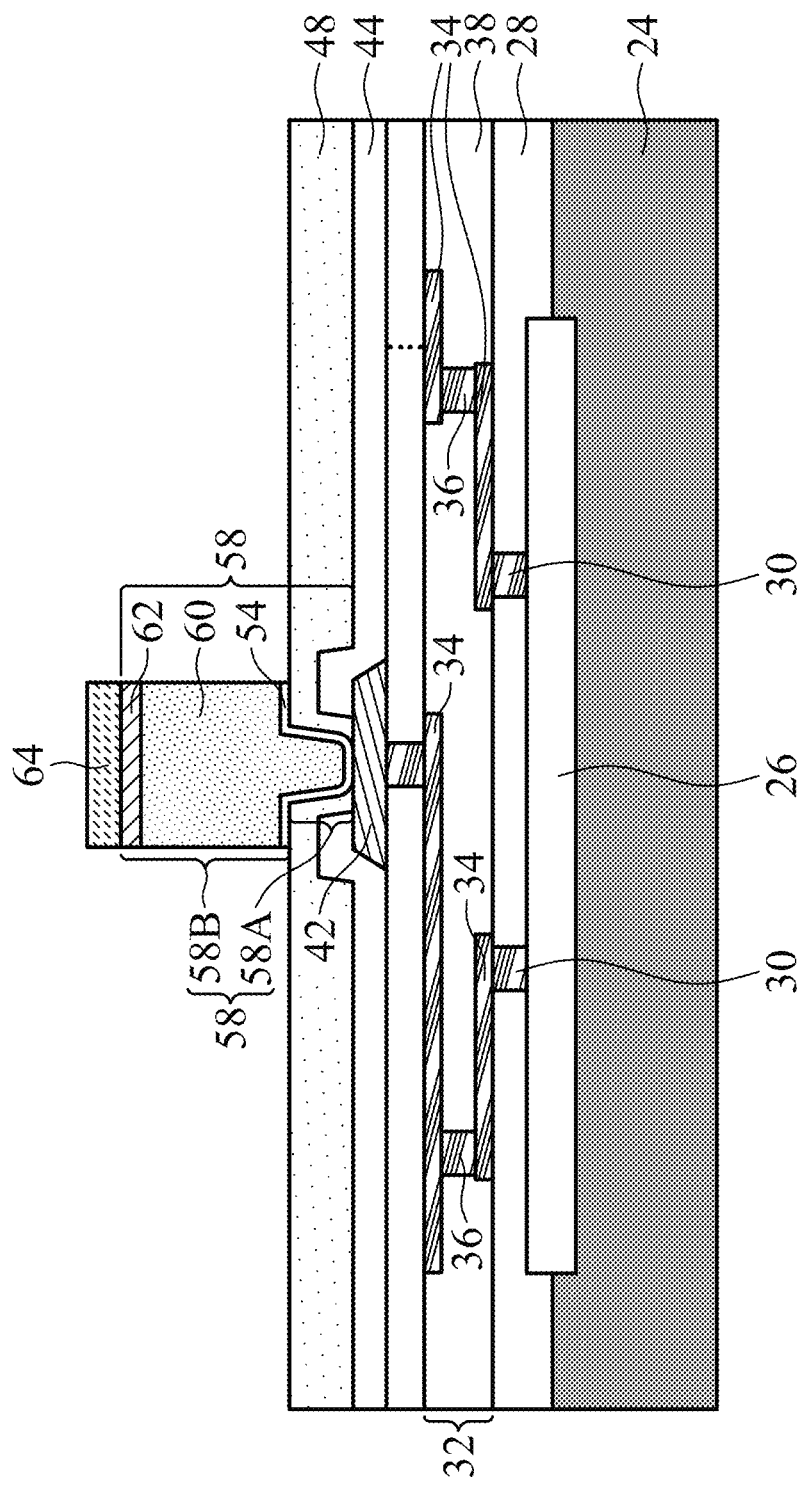

On top of metal bump 58, solder region 64 is formed, for example, by plating. The respective process is also illustrated as process 216 in the process flow 200 as shown in FIG. 19. Solder region 64 may be formed of a Sn—Ag alloy, a Sn—Ag—Cu alloy, or the like, and may be lead-free or lead-containing. In a subsequent process, plating mask 56 is removed in a stripping process, and the underlying portions of seed layer 54 are exposed. The respective process is illustrated as process 218 in the process flow 200 as shown in FIG. 19. For example, when plating mask 56 is formed of a photo resist, plating mask 56 may be ashed using oxygen. Next, the exposed portions of seed layer 54 that were previously covered by plating mask 56 are removed through etching, for example, using sub-atmospheric-pressure pure hydrogen glow plasma to etch copper. The mixture of $N_2$ and $H_2$ or the mixture of $Cl_2$ and Ar may be used as the process gas. Titanium, if included in the seed layer, may be etched using a fluorine-containing gas such as $SF_6$, or $CF_4$, or $NF_3$. The portions of seed layer 54 covered by metal bump 58 remain un-removed. The respective process is also illustrated as process 218 in the process flow 200 as shown in FIG. 19. The resulting structure is shown in FIG. 8. Throughout the description, the remaining portions of seed layer 54 are considered as being a part of the metal bump 58. Metal bump 58 includes via portion 58A extending into dielectric layer 48, and bump portion 58B higher than the top surface of dielectric layer 48. The sidewalls of the bump portion 58B of metal bump 58 may be substantially vertical and straight. The details of the profile of via portion 58A may be found referring to the profile shown in FIG. 11. For example, as shown in the magnified FIG. 11, the corner formed between the sidewall of passivation layer 44 and the top surface of metal pad 42 is sharper than the rounded bottom corner of the via portion 58A.

Figure 9:
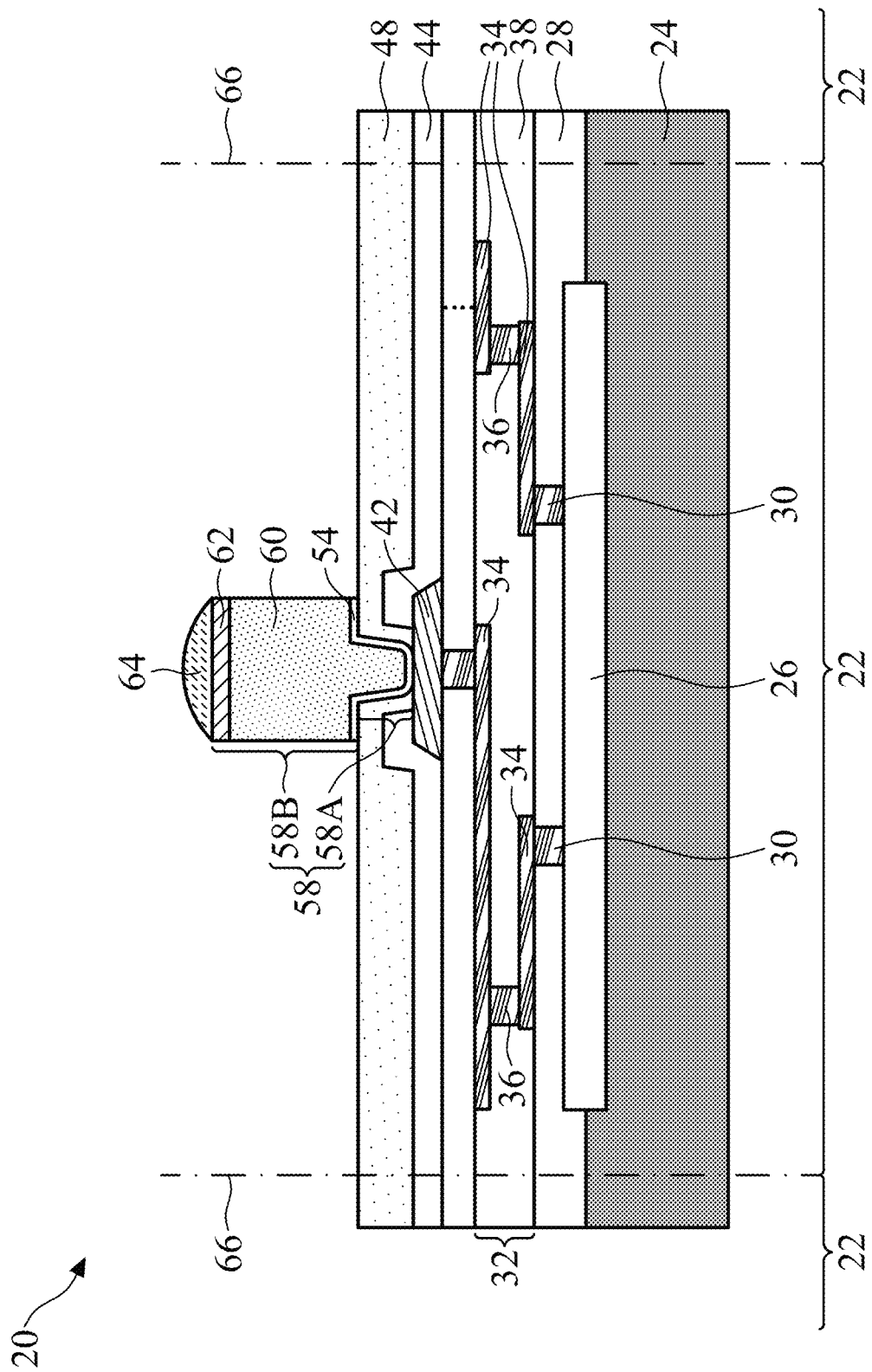

Referring to FIG. 9, solder region 64 is reflowed in a reflow process, for example, in a convection reflow process, laser reflow process, or the like. The respective process is illustrated as process 220 in the process flow 200 as shown in FIG. 19. Solder region 64 thus has a rounded surface.

Figure 12:
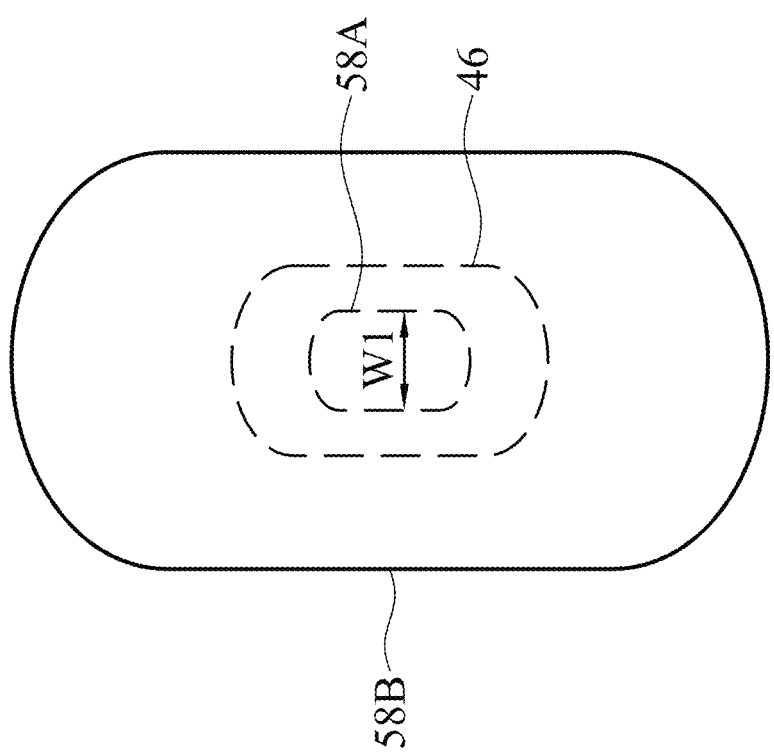
FIG. 12 illustrates a top view of a portion of a metal bump in accordance with some embodiments.

FIG. 12 illustrates a top view of metal bump 58. In accordance with some embodiments of the present disclosure, via portion 58A and bump portion 58B both have elongated shapes. In which case, the width W1 (also refer to FIGS. 4 and 11) is the smaller width (in the widthwise direction) of via portion 58A. In accordance with alternative embodiments of the present disclosure, metal bump 58 may have a non-elongated top view shape without a significant difference between the longer axis and shorter axis. For example, the top-view shape may be a circular shape, and width W1 is the diameter of the circular shape. The top-view shape via portion 58A and bump portion 58B of may also be hexagons, and width W1 is the distance between two parallel edges of the corresponding hexagon. The shape of opening 46 (FIG. 1) is also illustrated in FIG. 12.

Referring back to FIG. 9, wafer 20 is singulated in a die-saw process. The singulation is performed along scribe lines 66. The respective process is illustrated as process 222 in the process flow 200 as shown in FIG. 19. Package components 22 (which may be device dies, package substrate, interposers, packages, or the like) are thus separated from each other to form discrete package components.

Figure 10:
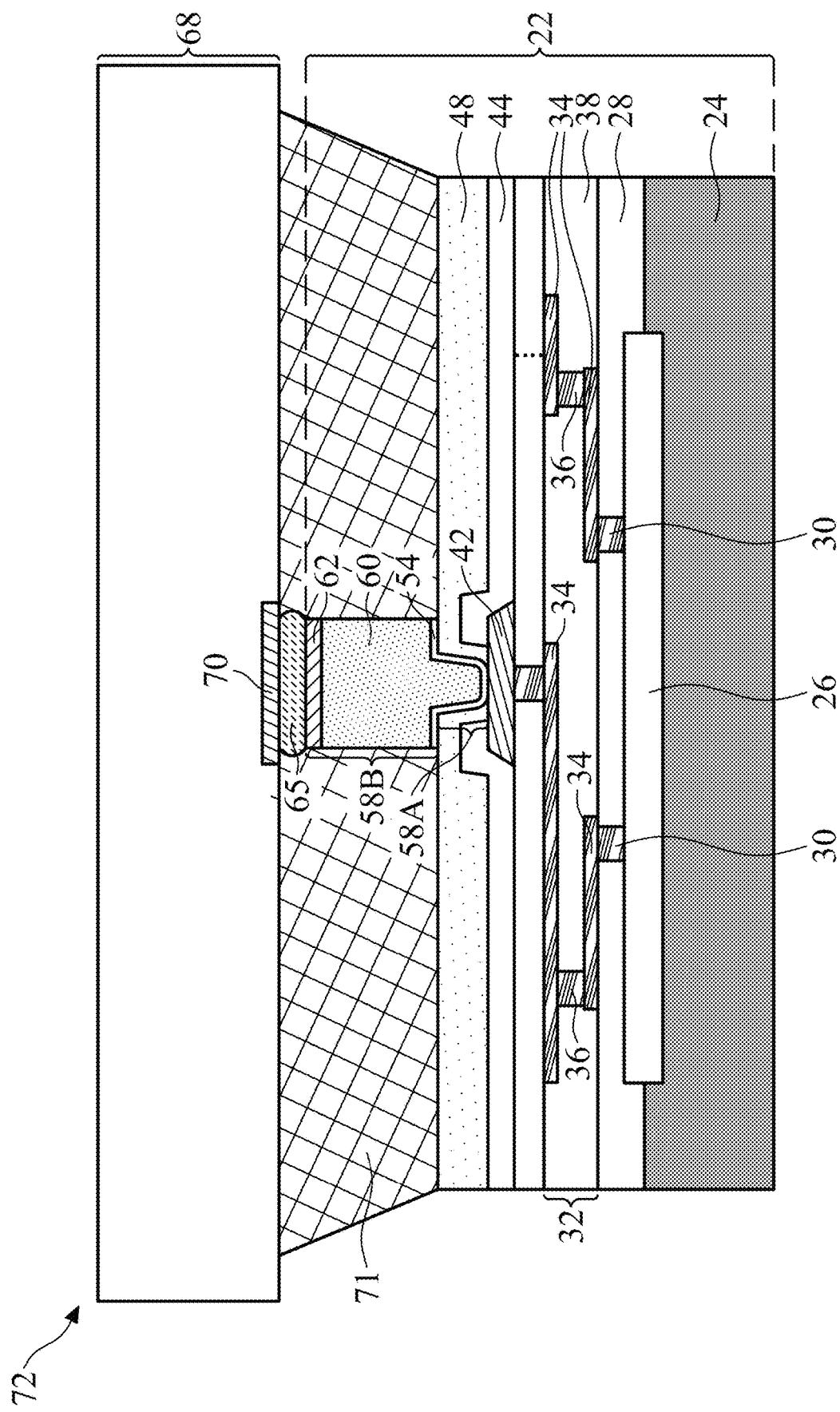

Next, Referring to FIG. 10, one of package components 22 is bonded to package component 68, which may be an interposer, a package substrate, a package, a device die, a printed circuit board, or the like. The respective process is illustrated as process 224 in the process flow 200 as shown in FIG. 19. The bonding may be through solder region 65, which includes the material of solder region 64 (FIG. 9). Solder region 65 may or may not include additional solder from the solder region pre-formed on conductive feature 70 in package component 68. Underfill 71 may be disposed into the gap between package component 22 and package component 68. Underfill 71 may be in contact with the top surface of dielectric layer 48, and may contact the sidewalls of bump portion 58B. Furthermore, Underfill 71 may encircle, and may be in contact with, metal bump 58. Package 72 is thus formed.

It has been found that when the stresses in low-k dielectric layers 38 increase to about 150 MPa, low-k dielectric layers 38 may crack. When the stress in low-k dielectric layers 38 is lower than about 150 MPa, low-k dielectric layers 38 will not crack. Accordingly, a plurality of simulations have been performed to determine the effect of some factors on the stress in low-k dielectric layers 38. The simulation results are illustrated in FIGS. 13, 14, 15, 16, and 17.

Figure 13:
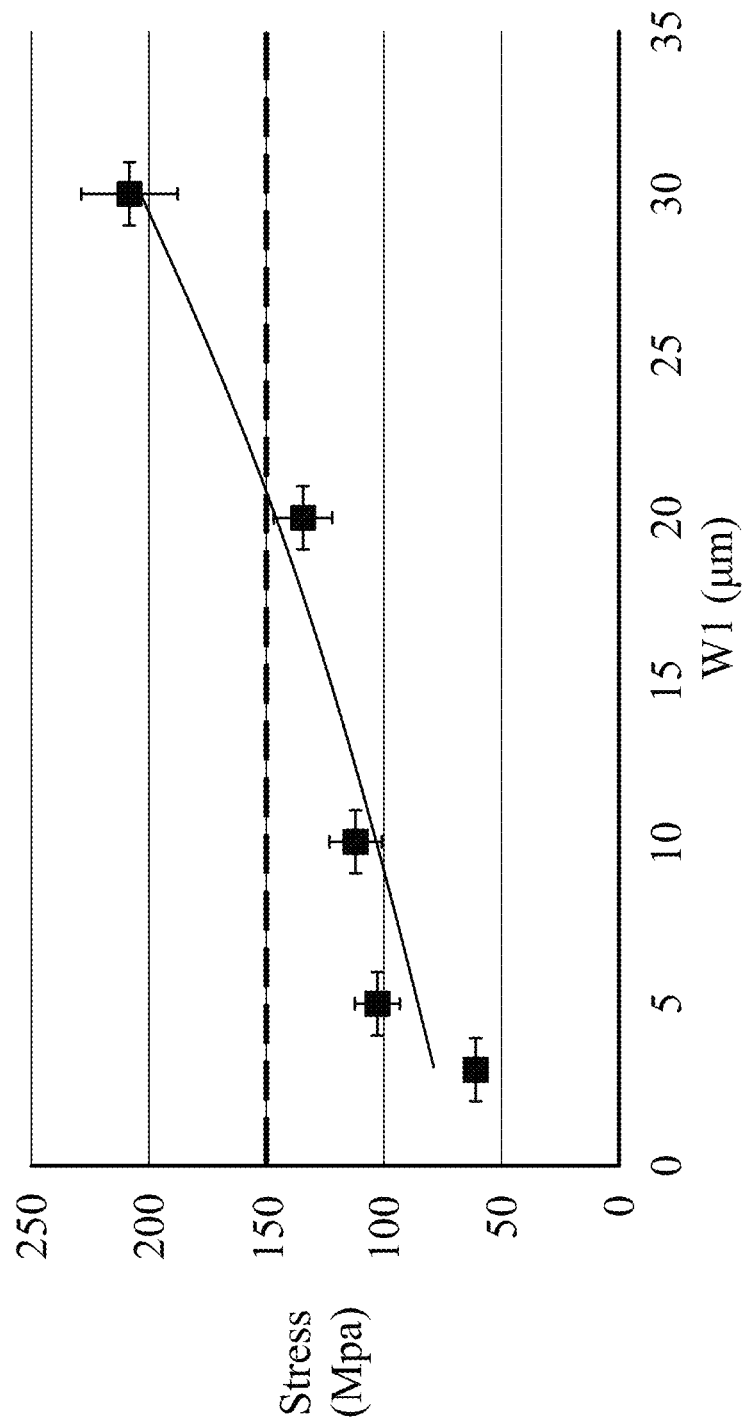
FIGS. 13 through 16 are simulation results in accordance with some embodiments.

FIG. 13 illustrates the simulation results, in which the stress in low-k dielectric layers 38 (FIG. 10) is illustrated as a function of the width W1 (FIG. 11) of the via portion 58A of the metal bump 58. The X-axis represents the width W1, and the Y-axis represents the stress in low-k dielectric layers 38. FIG. 13 reveals that with the increase in the width W1, the stress in low-k dielectric layers 38 increases. When the width W1 reaches about 20 μm or greater, the stress increases to the critical value of 150 MPa or higher. This means that low-k dielectric layers 38 will not crack when width W1 is smaller than 20 μm, and has the possibility of cracking when width W1 is greater than about 20 μm. Accordingly, reducing the width W1 results in the desirable reduction in the stress in low-k dielectric layers 38, and the width W1 is designed to be smaller than about 20 μm.

Figure 14:
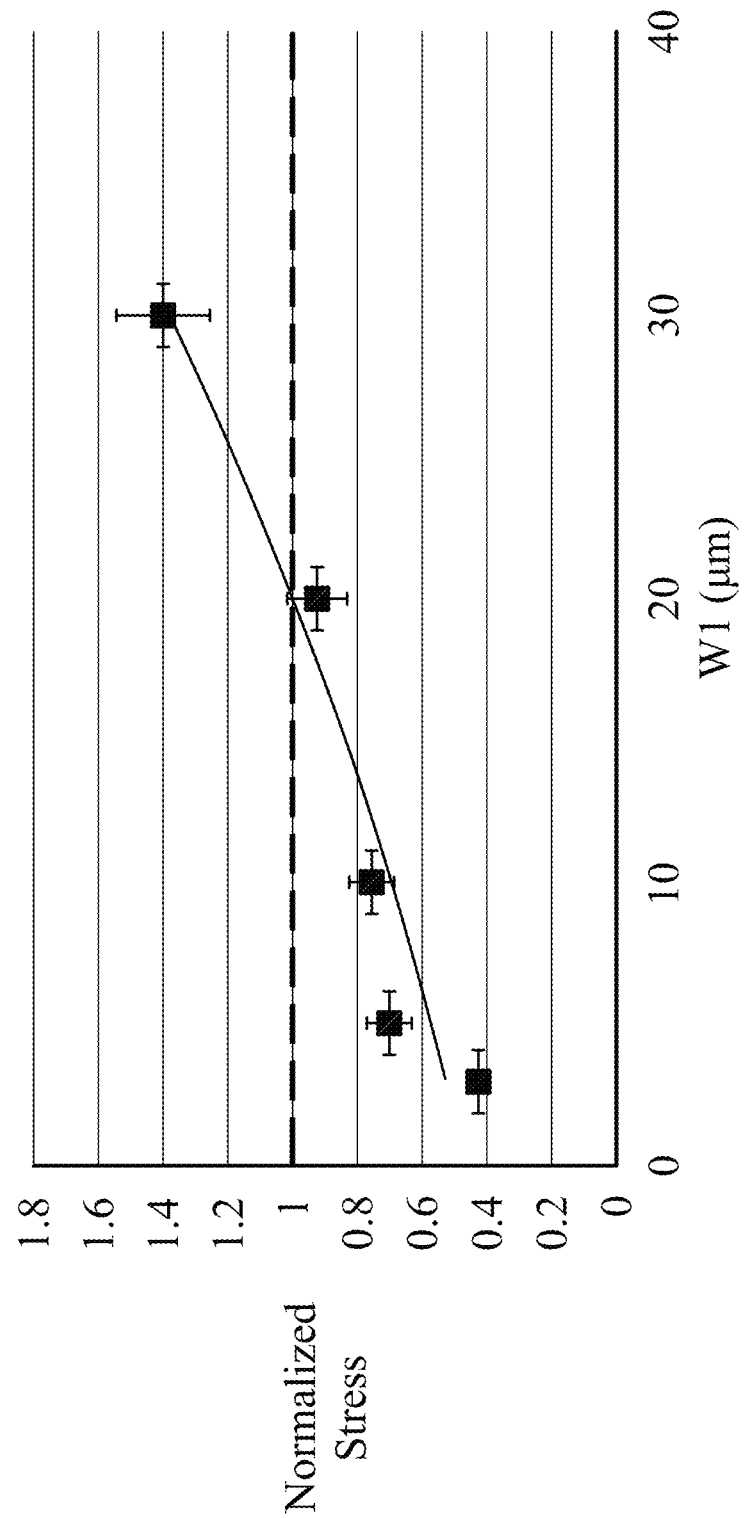

FIG. 14 illustrates the simulation results, wherein the normalized stress in low-k dielectric layers 38 (FIG. 10) is illustrated as a function of the width W1 (FIG. 11) of the via portion 58A. The X-axis represents the width W1, and the Y-axis represents the normalized stress in low-k dielectric layers 38, with the normalized stress being a ratio of the stress in dielectric layers 38 to the critical value of 150 MPa. Similar to FIG. 13, FIG. 14 reveals that with the increase in the width W1, the stress in low-k dielectric layers 38 increases. When the width W1 reaches about 20 μm, the normalized stress increases to 1.0. FIG. 14 also reveals that reducing the width W1 results in the desirable reduction in the stress in low-k dielectric layers 38, and the width W1 is designed to be smaller than about 20 μm.

Figure 15:
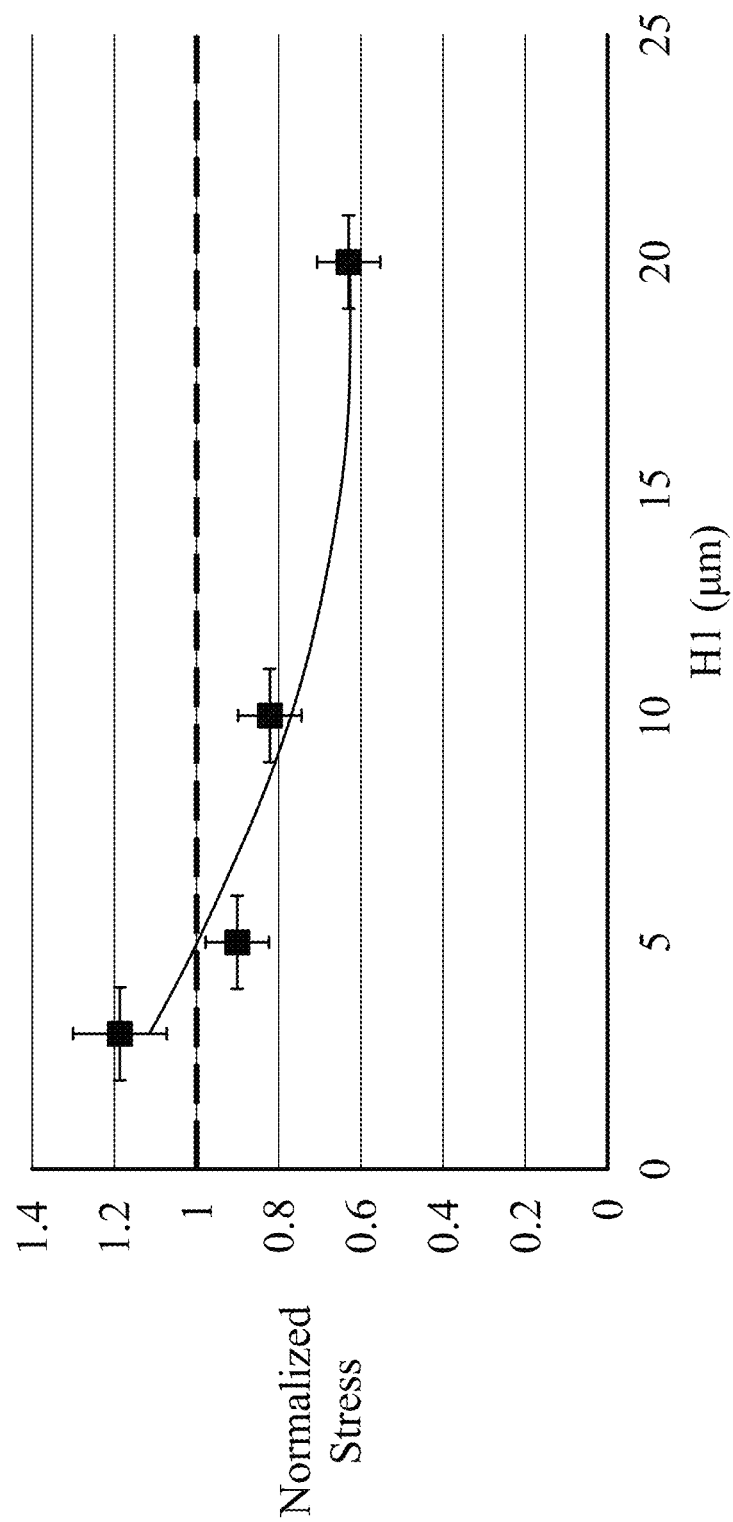

FIG. 15 illustrates the simulation results, wherein the stress in low-k dielectric layers 38 (FIG. 10) is illustrated as a function of the height H1 (FIG. 11) of the via portion 58A of the metal bump 58. The X-axis represents the height H1 in microns, and the Y-axis represents the normalized stress in low-k dielectric layers 38. FIG. 15 reveals that with the increase in the height H1, the stress in low-k dielectric layers 38 reduces. When the height H1 increases to about 5 μm or higher, the normalized stress reduces to the critical value of 1.0 or lower, which means that low-k dielectric layers 38 are unlikely to crack. Accordingly, increasing the height H1 results in the desirable reduction in the stress in low-k dielectric layers 38, and the height H1 is designed to be greater than about 5 μm.

Figure 16:
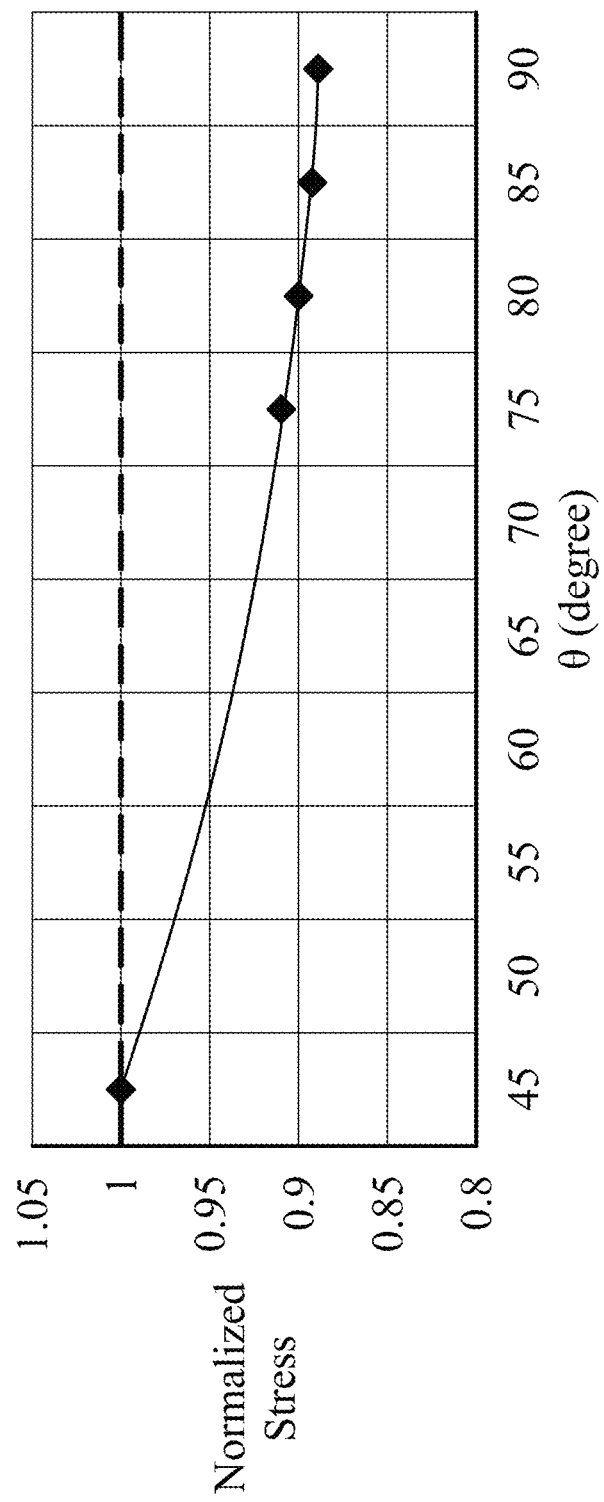

FIG. 16 illustrates the simulation results, wherein the stress in low-k dielectric layers 38 (FIG. 10) is illustrated as a function of the tilt angle θ of the sidewalls 48A (FIG. 11) of the via portion 58A. The X-axis represents the tilt angle θ, and the Y-axis represents the normalized stress in low-k dielectric layers 38, which is normalized to the critical value of 150 MPa. FIG. 16 reveals that with the increase in the tilt angle θ, the stress in low-k dielectric layers 38 reduces. When the tilt angle θ is greater than about 45 degrees, the normalized stress reduces to the critical value of 1.0, which means that low-k dielectric layers 38 will not crack. Accordingly, increasing the tilt angle θ results in the desirable reduction in the stress in low-k dielectric layers 38, and the tilt angle θ is designed to be greater than about 45 degrees. On the other hand, the tilt angle θ cannot be greater than 90 degrees since this will cause difficulty in forming a conformal seed layer 54 (FIG. 5), which causes problems (such as voids) in the subsequent plating of metal bump 58. In accordance with some embodiments of the present disclosure, tilt angle θ is in the range between about 70 degrees and about 80 degrees.

Figure 17:
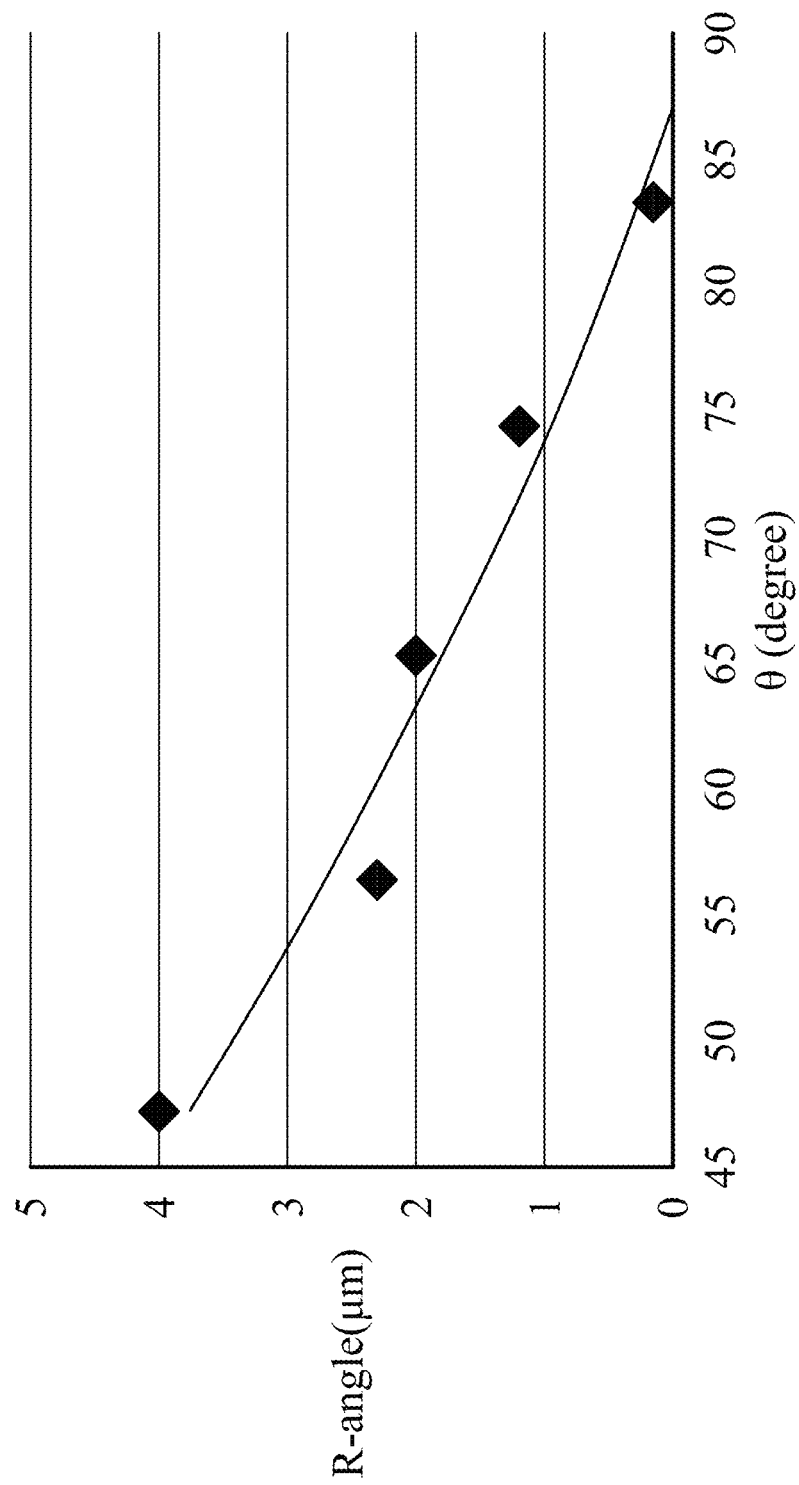
FIG. 17 illustrates the correlation between the tilt angles of the sidewalls of metal bumps and the R-angles of the corners of the metal bumps in accordance with some embodiments.

FIG. 17 illustrates the correlation of the R-angle and the tilt angle θ. The X-axis represents the tilt angle θ, and the Y-axis represents the R-angle. It is found that with the increase in the tilt angle θ, the R-angle reduces. As is aforementioned, reducing the tilt angle θ and/or reducing the R-angle may reduce the stress in low-k dielectric layers 38, and vice versa. Accordingly, FIG. 17 reveals that increasing the tilt angle θ has similar effect as increasing the R-angle, and vice versa. The correlation as shown in FIG. 17 may also be reflected as:

$$R\text{-angle}=0.0152\theta^2-0.5863\theta+4.3865 \qquad [\text{Eq. 1}]$$

As shown in FIGS. 13, 14, 15, 16, and 17, the reduction of the stress in low-k dielectric layers 38 may be achieved through reducing the R-angle, reducing the width W1 of the via portion of metal bump 58, increasing the thickness H1 of dielectric layer 48, and increasing the tilt angle θ. Simulation results have revealed that when the width W1 (FIG. 11) is smaller than about 20 μm, the height H1 is greater than about 5 μm, and the tilt angle is greater than about 45 degrees (and smaller than 90 degrees), no crack will be resulted in the low-k dielectric layers by the stress applied by the metal bump 58 and dielectric layer 48.

Figure 18:
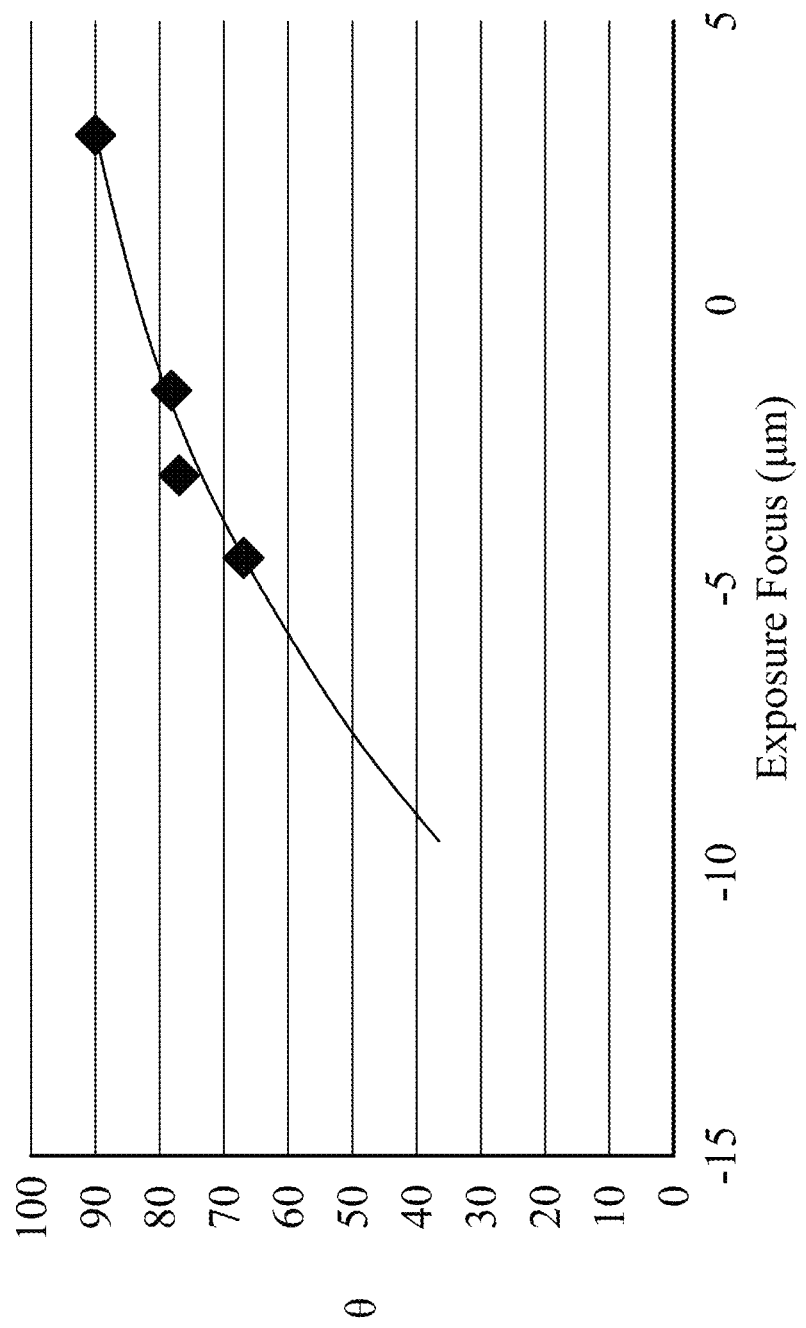
FIG. 18 illustrates the correlation between the tilt angles of the sidewalls of metal bumps and the exposure focus in accordance with some embodiments.

FIG. 18 illustrates a relationship between tilt angle θ and the exposure focus for performing the light exposure on dielectric layer 48 (when dielectric layer 48 is a light-sensitive layer) in the process shown in FIG. 2. It is appreciated that FIG. 18 illustrates an example, and the relationship may be different when different exposure tool is used. As shown in FIG. 18, the profile angle may be increased by increasing the exposure focus in accordance with some embodiments.

The embodiments of the present disclosure have some advantageous features. By adjusting the composition of the applied polymer, the profile of the via portion of the metal bump, which profile includes the bottom width W1 of the via portion of the metal bump, the thickness of the polymer, and the tilt angle θ of the sidewall of the via portion of the metal bump, is adjusted to the desired profile, so that the stress in the underlying low-k dielectric layers is reduced, and the cracking in the low-k dielectric layers is avoided.

In accordance with some embodiments of the present disclosure, a method of forming an integrated circuit structure comprises forming a patterned passivation layer over a metal pad, with a top surface of the metal pad revealed through a first opening in the patterned passivation layer; applying a polymer layer over the patterned passivation layer, wherein the polymer layer is substantially free from NMP, and wherein the polymer layer comprises aliphatic amide as a solvent; performing a light-exposure process on the polymer layer; performing a development process on the polymer layer to form a second opening in the polymer layer, wherein the top surface of the metal pad is revealed to the second opening; baking the polymer; and forming a conductive region comprising a via portion extending into the second opening. In an embodiment, the polymer layer comprises alkoxy decane. In an embodiment, the via portion comprise a straight sidewall; a straight bottom surface; and a round corner comprising a top end connecting to the straight sidewall, and a bottom end connecting to the straight bottom surface, wherein the round corner has an R-angle smaller than about 4 μm. In an embodiment, the straight sidewall has a tilt angle in a range between about 45 degrees and about 90 degrees. In an embodiment, the straight sidewall has a tilt angle in a range between about 70 degrees and about 80 degrees. In an embodiment, after the baking process, the polymer layer has a thickness greater than about 5 μm. In an embodiment, when the polymer layer is applied, the NMP has a weight percentage smaller than about 0.3 percent in the polymer layer. In an embodiment, when the polymer layer is applied, the polymer layer is free from NMP.

In accordance with some embodiments of the present disclosure, a method of forming an integrated circuit structure comprises applying a polymer layer over a metal pad; patterning the polymer layer to form an opening in the polymer layer, wherein a top surface of the metal pad is revealed to the opening, and the polymer layer comprises: a straight sidewall facing the opening; and a round corner surface comprising a top end connecting to the straight sidewall, and a bottom end joining to the top surface of the metal pad, wherein the round corner surface has an R-angle smaller than about 4 μm; and forming a conductive region comprising: a via portion extending into the opening; and a bump portion over the polymer layer. In an embodiment, the polymer layer, when applied, comprises aliphatic amide as a solvent. In an embodiment, the polymer layer, when applied, is free from NMP. In an embodiment, the polymer layer comprises silicon alkoxide. In an embodiment, the method further includes baking the polymer layer after the polymer layer is patterned.

In accordance with some embodiments of the present disclosure, an integrated circuit structure comprises a metal pad; a polymer layer over and contacting the metal pad; and a metal bump comprising a via portion in the polymer layer, wherein the via portion comprises: a straight sidewall; a straight bottom surface; and a round bottom corner comprising a top end connecting to the straight sidewall, and a bottom end connecting to the straight bottom surface, wherein the round bottom corner has an R-angle smaller than about 4 μm; and a bump portion over the polymer layer and joining to the via portion. In an embodiment, the straight sidewall has a tilt angle in a range between about 45 degrees and about 90 degrees. In an embodiment, the tilt angle is in a range between about 70 degrees and about 80 degrees. In an embodiment, the polymer layer comprises silicon alkoxide. In an embodiment, a portion of the polymer layer directly over the metal pad has a thickness greater than about 5 μm. In an embodiment, the via portion contacts a top surface of the metal pad to form an interface, and the interface has a width smaller than about 20 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a metal pad comprising a first top surface;
   a passivation layer contacting the metal pad, wherein the passivation layer comprises a second top surface comprising:
      a first portion located beyond an edge of the metal pad;
      a second portion overlapping the metal pad; and
      a sidewall joining the second portion of the second top surface to the first top surface, wherein the sidewall forms a corner with the first top surface;
   a polymer layer comprising a third top surface, wherein the polymer layer is over and contacting the metal pad, and wherein the polymer layer comprises:
      rising-up portions comprising third portions of the third top surface of the polymer layer; and
      additional portions farther away from the metal pad than the rising-up portions, wherein the additional portions comprise fourth portions of the third top surface of the polymer layer, wherein the third portions are higher than the fourth portions, and wherein the third portions are more curved than respective underlying parts of the second portion of the second top surface of the passivation layer; and
   a metal bump comprising:
      a via portion in the polymer layer, wherein the via portion comprises:
         a straight sidewall;
         a straight bottom surface; and
         a round bottom corner comprising a top end connecting to the straight sidewall, and a bottom end connecting to the straight bottom surface, wherein the corner is sharper than the round bottom corner, and wherein the rising-up portions located on opposite sides of the via portion have a same shape and a same rising-up height.

2. The structure of claim 1, wherein the straight sidewall has a tilt angle in a range between about 45 degrees and about 90 degrees.

3. The structure of claim 2, wherein the tilt angle is in a range between about 70 degrees and about 80 degrees.

4. The structure of claim 1, wherein the polymer layer comprises silicon alkoxide.

5. The structure of claim 1, wherein a portion of the polymer layer directly over the metal pad has a thickness greater than about 5 μm, and the portion of the polymer layer comprises one of the rising-up portions.

6. The structure of claim 1, wherein the via portion contacts the first top surface of the metal pad to form an interface, and the interface has a width smaller than about 20 μm.

7. The structure of claim 1, wherein top surfaces of the polymer layer have a height difference in a range between about 0.5 μm and about 1.5 μm.

8. The structure of claim 1, wherein the second portion of the second top surface of the passivation layer is flat, and a portion of the third top surface of the polymer layer overlapping the second portion of the second top surface of the passivation layer is curved.

9. The structure of claim 1, wherein the round bottom corner fits a circle that has a diameter, and the diameter is greater than 0 μm and smaller than about 4 μm.

10. A structure comprising:
a metal pad;
a passivation layer extending over the metal pad and covering an edge portion of the metal pad, wherein the passivation layer comprises a first top surface comprising first parts overlapping the metal pad;
a polymer layer over the passivation layer, wherein a portion of the polymer layer extends into the passivation layer to contact the metal pad, and wherein the polymer layer comprises a second top surface comprising second parts overlapping the first parts, and wherein the second parts are between, and are rising-up parts higher than, additional parts of the second top surface that are farther away from the metal pad than the second parts, and wherein the rising-up parts are more curved than respective parts of the first top surface that are overlapped by the rising-up parts of the second top surface;
a conductive region comprising:
a via portion extending into the polymer layer and the passivation layer to contact the metal pad, wherein the rising-up parts of the second top surface are on opposite sides of the via portion, and have a same shape and a same height; and
a bump portion over the polymer layer.

11. The structure of claim 10, wherein the polymer layer comprises alkoxy decane.

12. The structure of claim 10, wherein the via portion of the conductive region comprises:
a straight sidewall;
a straight bottom surface; and
a round corner comprising a top end connecting to the straight sidewall, and a bottom end connecting to the straight bottom surface, wherein the round corner is more rounded than a corner formed between a sidewall of the passivation layer and a top surface of the metal pad.

13. The structure of claim 12, wherein the round corner fits a circle, and the circle has a diameter in a range between about 1 μm and about 3 μm.

14. The structure of claim 13, wherein the straight sidewall has a tilt angle in a range between about 70 degrees and about 80 degrees.

15. The structure of claim 10, wherein a portion of the polymer layer directly over the metal pad has a thickness greater than about 5 μm.

16. A structure comprising:
a conductive pad;
a passivation layer extending over the conductive pad and covering a portion of the conductive pad, wherein the passivation layer comprises a first top surface;
a polymer layer over the passivation layer, wherein a portion of the polymer layer extends into the passivation layer, wherein the polymer layer comprises a second top surface, and the second top surface comprises:
first portions located beyond edges of the conductive pad; and
second portions overlapping the conductive pad and between the first portions, wherein the second portions are rising-up portions higher than the first portions, and wherein the second portions are more curved than parts of the first top surface of the passivation layer overlapped by the second portions of the second top surface of the polymer layer;
a conductive region comprising:
a via portion in the polymer layer, and wherein the second portions are on opposite sides of the via portion, and have a same shape and a same rising-up height; and
a bump portion over the via portion, wherein the bump portion overlaps and is in physical contact with the curved second portions of the second top surface of the polymer layer.

17. The structure of claim 16, wherein the polymer layer comprises silicon alkoxide.

18. The structure of claim 16, wherein an entirety of the bump portion overlaps the conductive pad.

19. The structure of claim 18, wherein the second portions are higher than the first portions by a height difference in a range between about 0.5 μm and about 1.5 μm.

20. The structure of claim 18, wherein the curved second portions of the second top surface continuously connect the first portions to a straight sidewall of the via portion of the conductive region.

* * * * *